(12) United States Patent
Cheng et al.

(10) Patent No.: US 10,637,145 B2
(45) Date of Patent: Apr. 28, 2020

(54) STACKED ANTENNA MODULE

(71) Applicant: INPAQ TECHNOLOGY CO., LTD., Miaoli County (TW)

(72) Inventors: Ta-Fu Cheng, Miaoli County (TW); Chih-Ming Su, Taipei (TW)

(73) Assignee: INPAQ TECHNOLOGY CO., LTD., Miaoli County (TW)

( * ) Notice: Subject to any disclaimer, the term of this patent is extended or adjusted under 35 U.S.C. 154(b) by 128 days.

(21) Appl. No.: 15/724,807

(22) Filed: Oct. 4, 2017

(65) Prior Publication Data
US 2019/0044235 A1 Feb. 7, 2019

(30) Foreign Application Priority Data
Aug. 2, 2017 (TW) .............................. 106126079 A

(51) Int. Cl.
| | |
|---|---|
| H01Q 9/04 | (2006.01) |
| H01Q 1/22 | (2006.01) |
| H01Q 5/40 | (2015.01) |
| H01Q 21/28 | (2006.01) |
| H01L 23/64 | (2006.01) |
| H01L 25/065 | (2006.01) |
| H01L 23/66 | (2006.01) |
| H01Q 5/35 | (2015.01) |

(52) U.S. Cl.
CPC ........... H01Q 9/0414 (2013.01); H01L 23/64 (2013.01); H01L 23/66 (2013.01); H01L 25/0657 (2013.01); H01Q 1/2283 (2013.01); H01Q 5/40 (2015.01); H01Q 9/045 (2013.01); H01Q 21/28 (2013.01); H01L 2223/6677 (2013.01); H01Q 5/35 (2015.01)

(58) Field of Classification Search
CPC ........ H01Q 9/0414; H01Q 9/045; H01Q 1/22; H01Q 1/2258; H01Q 1/2266; H01Q 1/2283; H01Q 1/24; H01Q 1/241; H01Q 1/242; H01Q 1/243; H01Q 5/35; H01Q 5/40; H01Q 21/28; H01L 23/64; H01L 25/0657
See application file for complete search history.

(56) References Cited

U.S. PATENT DOCUMENTS

| | | | | |
|---|---|---|---|---|
| 5,121,127 A | * | 6/1992 | Toriyama ............. | H01Q 9/0414 343/700 MS |
| 8,094,075 B2 | * | 1/2012 | Cheng .................. | H01Q 9/0414 343/700 MS |
| 9,653,808 B2 | * | 5/2017 | Hwang ................ | H01Q 9/0414 |

* cited by examiner

*Primary Examiner* — Daniel Munoz
*Assistant Examiner* — Patrick R Holecek
(74) *Attorney, Agent, or Firm* — Li & Cai Intellectual Property (USA) Office

(57) ABSTRACT

The present invention provides a portable electronic device and a stacked antenna module thereof. The stacked antenna module includes a first antenna structure and a second antenna structure stacked on the first antenna structure and insulated from the first antenna structure. The first antenna structure includes a first carrier substrate having at least one through hole, a surrounding insulation layer disposed inside the at least one through hole, and a first feeding pin passing through the first carrier substrate. The second antenna structure includes a second carrier substrate and a second feeding pin passing through the second carrier substrate, and the second feeding pin passes through the surrounding insulation layer without contacting the surrounding insulation layer.

8 Claims, 8 Drawing Sheets

STACKED ANTENNA MODULE

FIELD OF THE INVENTION

The present disclosure relates to an electronic device and an antenna module thereof, and more particularly to a portable electronic device and a stacked antenna module thereof.

BACKGROUND OF THE INVENTION

With the development of wireless communication technologies, wireless transmission technologies are widely used in mobile information media or personal data management tools. For example, electronic products, such as notebook computers and smartphones, usually need to transmit data to other data devices or receive data from other data devices. Based on wireless transmission technologies, many structures can be simplified and many connecting wires can be avoided. To achieve the above-mentioned wireless transmission, conventional electronic products must have antennae, and most of the electronic products have inbuilt antenna devices for wireless communication. A top antenna structure and a bottom antenna structure of a stacked antenna module, however, may interfere with each other to lead to an interference model.

SUMMARY OF THE INVENTION

One aspect of the present disclosure relates to a portable electronic device and a stacked antenna module thereof for decreasing or suppressing an interference model and enabling a main model to be increased or presented obviously.

One of the embodiments of the present disclosure provides a stacked antenna module, including a first antenna structure disposed on a circuit substrate, an insulating connection layer disposed on the first antenna structure, and a second antenna structure disposed on the insulating connection layer. The first antenna structure includes a first carrier substrate having at least one through hole, a first top electrode layer disposed on a top surface of the first carrier substrate, and a first feeding pin passing through the first carrier substrate and electrically connected to the first top electrode layer. The second antenna structure includes a second carrier substrate, a second top electrode layer disposed on a top surface of the second carrier substrate, and a second feeding pin passing through the second carrier substrate and electrically connected to the second top electrode layer. The first antenna structure includes a surrounding insulation layer disposed inside the at least one through hole and connected to the first top electrode layer, and the second feeding pin passes through the surrounding insulation layer without contacting the surrounding insulation layer.

Another one of the embodiments of the present disclosure provides a stacked antenna module, including a first antenna structure and a second antenna structure stacked on the first antenna structure and insulated from the first antenna structure. The first antenna structure includes a first carrier substrate having at least one through hole, a surrounding insulation layer disposed inside the at least one through hole, and a first feeding pin passing through the first carrier substrate. The second antenna structure includes a second carrier substrate and a second feeding pin passing through the second carrier substrate, and the second feeding pin passes through the surrounding insulation layer without contacting the surrounding insulation layer.

Yet another one of the embodiments of the present disclosure provides a portable electronic device using a stacked antenna module, characterized in that the stacked antenna module includes a first antenna structure and a second antenna structure stacked on the first antenna structure and insulated from the first antenna structure. The first antenna structure includes a first carrier substrate having at least one through hole, a surrounding insulation layer disposed inside the at least one through hole, and a first feeding pin passing through the first carrier substrate. The second antenna structure includes a second carrier substrate and a second feeding pin passing through the second carrier substrate, and the second feeding pin passes through the surrounding insulation layer without contacting the surrounding insulation layer.

Therefore, by matching the features of "the first antenna structure including a first carrier substrate having at least one through hole, a surrounding insulation layer disposed inside the at least one through hole, and a first feeding pin passing through the first carrier substrate" and "the second antenna structure including a second carrier substrate and a second feeding pin passing through the second carrier substrate, and the second feeding pin passing through the surrounding insulation layer without contacting the surrounding insulation layer", an interference model generated by the second antenna structure can be decreased or suppressed, and a main model generated by the second antenna structure can be increased or presented obviously.

To further understand the techniques, means and effects of the present disclosure, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION OF THE PREFERRED EMBODIMENTS

Embodiments of a portable electronic device and a stacked antenna module thereof according to the present disclosure are described herein. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

First Embodiment

Figure 1:
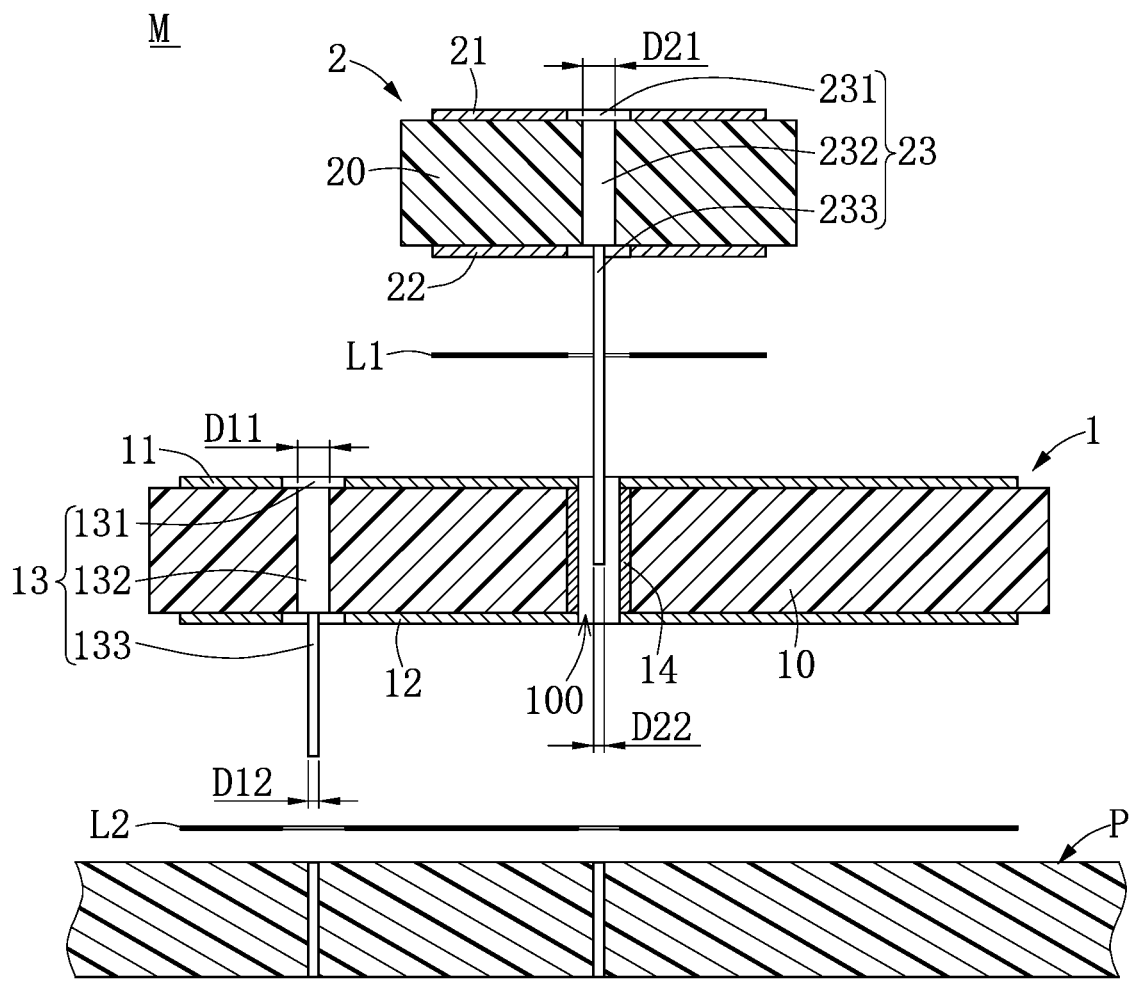
FIG. 1 shows an exploded, schematic view of a stacked antenna module according to the first embodiment of the present disclosure.
Figure 2:
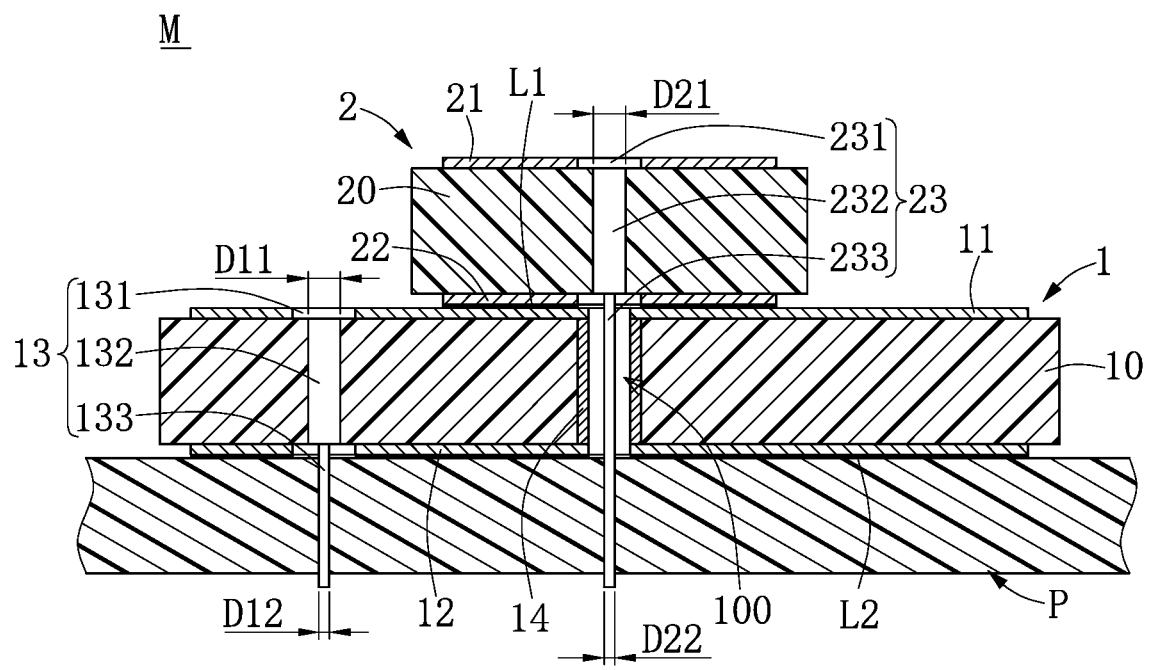
FIG. 2 shows an assembly, schematic view of the stacked antenna module according to the first embodiment of the present disclosure.
Figure 3:
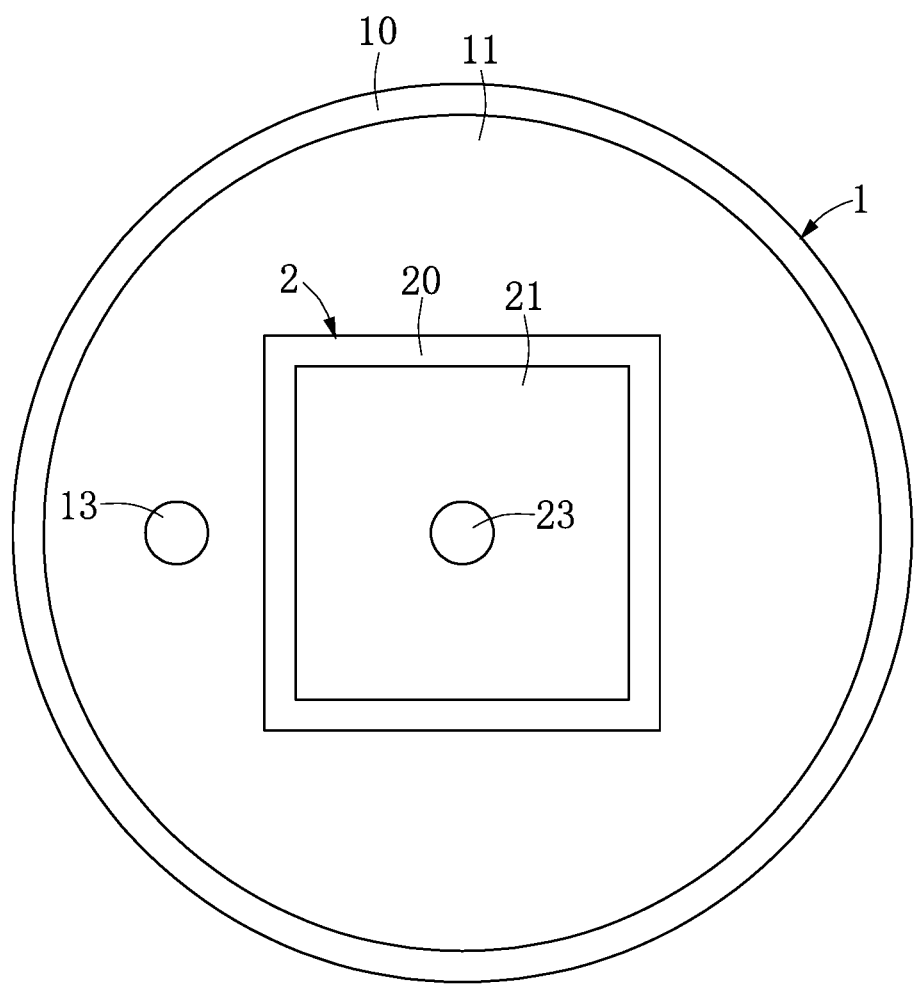
FIG. 3 shows a top, schematic view of the stacked antenna module according to the first embodiment of the present disclosure.

Referring to FIG. 1 to FIG. 3, the first embodiment of the present disclosure provides a stacked antenna module M, including a first antenna structure 1 and a second antenna structure 2. The first antenna structure 1 is disposed on a circuit substrate P, an insulating connection layer L1 is disposed on the first antenna structure 1, and the second antenna structure 2 is disposed on the insulating connection layer L1. That is to say, the second antenna structure 2 can be stacked on the first antenna structure 1 through the insulating connection layer L1. For example, the first antenna structure 1 may be a linear antenna, a right-hand circular polarization antenna or a left-hand circular polarization antenna, and the second antenna structure 2 may be a linear antenna, a right-hand circular polarization antenna or a left-hand circular polarization antenna, but it is not meant to limit the scope of the present disclosure. In addition, the first antenna structure 1 can be stacked on the circuit substrate P through another insulating connection layer L2, and the insulating connection layer (L1 or L2) may be a double-sided adhesive layer such as a double-sided tape, but it is not meant to limit the scope of the present disclosure.

Firstly, referring to FIG. 1 and FIG. 2, the first antenna structure 1 includes a first carrier substrate 10 having at least one through hole 100, a first top electrode layer 11 disposed on a top surface of the first carrier substrate 10, a first bottom electrode layer 12 disposed on a bottom surface of the first carrier substrate 10, and a first feeding pin 13 passing through the first carrier substrate 10 and electrically connected to the first top electrode layer 11. For example, the first carrier substrate 10 may be a dielectric substrate having a predetermined dielectric coefficient, and the first antenna structure 1 can be designed as a high frequency antenna or a low frequency antenna according to different requirements, but it is not meant to limit the scope of the present disclosure.

Moreover, referring to FIG. 1 and FIG. 2, the second antenna structure 2 includes a second carrier substrate 20, a second top electrode layer 21 disposed on a top surface of the second carrier substrate 20, a second bottom electrode layer 22 disposed on a bottom surface of the second carrier substrate 20, and a second feeding pin 23 passing through the second carrier substrate 20 and electrically connected to the second top electrode layer 21. For example, the second carrier substrate 20 may be a dielectric substrate having a predetermined dielectric coefficient, and the second antenna structure 2 can be designed as a high frequency antenna or a low frequency antenna according to different requirements, but it is not meant to limit the scope of the present disclosure.

Furthermore, referring to FIG. 1 and FIG. 2, the first antenna structure 1 includes a surrounding insulation layer 14 disposed inside the at least one through hole 100 and connected to the first top electrode layer 11. More particularly, the second feeding pin 23 can pass through the surrounding insulation layer 14 without contacting the surrounding insulation layer 14 (that is to say, the second feeding pin 23 is surrounded by the surrounding insulation layer 14 and is separated from the surrounding insulation layer 14), and the surrounding insulation layer 14 is connected between the first top electrode layer 11 and the first bottom electrode layer 12. For example, the surrounding insulation layer 14 may be a shorting (short-circuit) ring or a shielding ring, and the surrounding insulation layer 14 can be formed on an inner surface of the through hole 100 by a coating method, a printing method, or any other forming method, or the surrounding insulation layer 14 can be manufactured in advance and then the prefabricated surrounding insulation layer 14 can be placed inside the through hole 100, but it is not meant to limit the scope of the present disclosure.

Therefore, the surrounding insulation layer 14 of the stacked antenna module M can be used to prevent the second antenna structure 2 (such as a top antenna structure) from being interfered by the first antenna structure 1 (such as a bottom antenna structure), so that an interference model generated by the second antenna structure 2 can be decreased or suppressed, and a main model generated by the second antenna structure 2 can be increased or presented obviously. For example, when the second feeding pin 23 of the second antenna structure 2 passes through the first antenna structure 1, the surrounding insulation layer 14 can be used to avoid the second antenna structure 2 being interfered by the first antenna structure 1, so that an antenna model generated by the second antenna structure 2 would be clear and obvious. Hence, the present disclosure can provide a stacked antenna module M having a high gain, a low axial ratio and an improved impedance matching by using the surrounding insulation layer 14 that is disposed inside the at least one through hole 100 and connected to the first top electrode layer 11.

For example, referring to FIG. 1 and FIG. 2, the first feeding pin 13 has a first top portion 131 connected to the first top electrode layer 11 and partially exposed out of the first top electrode layer 11, a first embedded portion 132 connected to the first top portion 131 and embedded inside the first carrier substrate 10, and a first pin portion 133 connected to the first embedded portion 132 and exposed out of the first carrier substrate 10. In addition, a diameter D11 of the first embedded portion 132 is larger than a diameter D12 of the first pin portion 133, and the first pin portion 133 is electrically connected to the circuit substrate P. However, it is not meant to limit the scope of the present disclosure.

For example, referring to FIG. 1 and FIG. 2, the second feeding pin 23 has a second top portion 231 connected to the second top electrode layer 21 and partially exposed out of the second top electrode layer 21, a second embedded portion 232 connected to the second top portion 231 and embedded inside the second carrier substrate 20, and a second pin portion 233 connected to the second embedded portion 232 and exposed out of the second carrier substrate 20. In addition, a diameter D21 of the second embedded portion 232 is larger than a diameter D22 of the second pin portion 233, and the second pin portion 233 can pass through the surrounding insulation layer 14 without contacting the surrounding insulation layer 14 and is electrically connected to the circuit substrate P. However, it is not meant to limit the scope of the present disclosure.

For example, as shown in FIG. 3, the first carrier substrate 10 may be a round substrate, and the first top electrode layer 11 may be a round electrode, so that the interference model generated by the second antenna structure 2 can be reduced. In addition, the second carrier substrate 20 may be a square substrate, and the second top electrode layer 21 may be a square electrode. However, it is not meant to limit the scope of the present disclosure.

Second Embodiment

Figure 4:
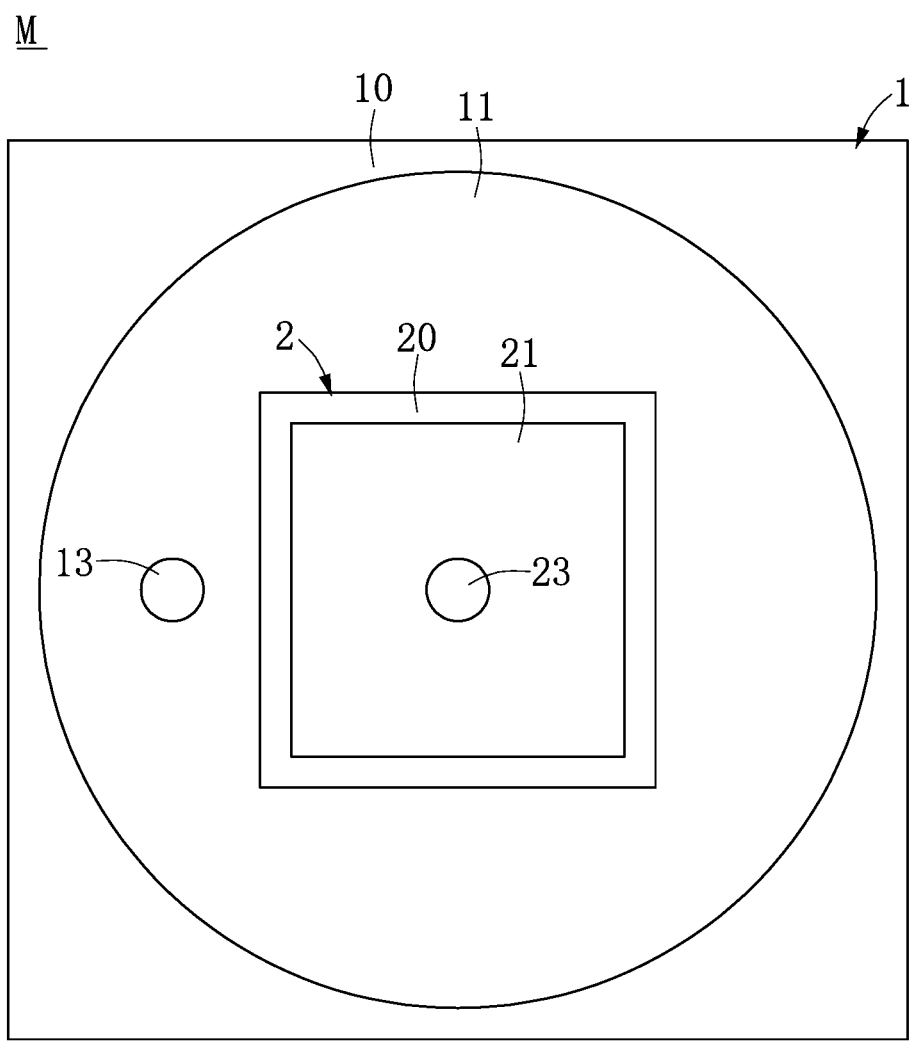
FIG. 4 shows a top, schematic view of the stacked antenna module according to the second embodiment of the present disclosure.

Referring to FIG. 4, the second embodiment of the present disclosure provides a stacked antenna module M, including a first antenna structure 1 and a second antenna structure 2. Comparing FIG. 4 with FIG. 3, the difference between the second embodiment and the first embodiment is as follows: in the second embodiment, the first carrier substrate 10 may be a square substrate. That is to say, the first carrier substrate 10 may be a round substrate as shown in the first embodiment (as shown in FIG. 3), or the first carrier substrate 10 may be a square substrate as shown in the second embodiment (as shown in FIG. 4), according to different requirements.

Third Embodiment

Figure 5:
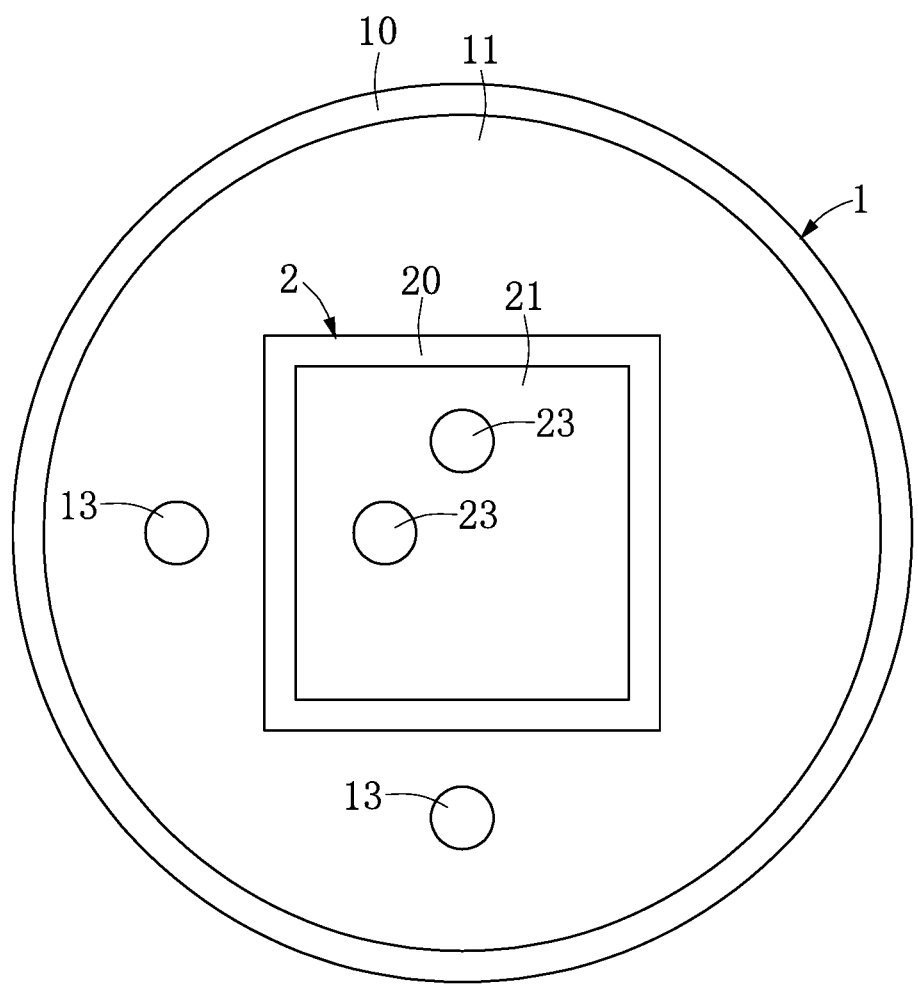
FIG. 5 shows a top, schematic view of the stacked antenna module according to the third embodiment of the present disclosure.

Referring to FIG. 5, the third embodiment of the present disclosure provides a stacked antenna module M, including a first antenna structure 1 and a second antenna structure 2. Comparing FIG. 5 with FIG. 3, the difference between the third embodiment and the first embodiment is as follows: in the third embodiment, the first antenna structure 1 includes at least two first feeding pins 13, and the second antenna structure 2 includes at least two second feeding pins 23. That is to say, the stacked antenna module M can use at least one first feeding pin 13 and at least one second feeding pin 23 as shown in the first embodiment (as shown in FIG. 3), or the stacked antenna module M can use at least two first feeding pins 13 and at least two second feeding pins 23 as shown in the third embodiment (as shown in FIG. 5).

Fourth Embodiment

Figure 6:
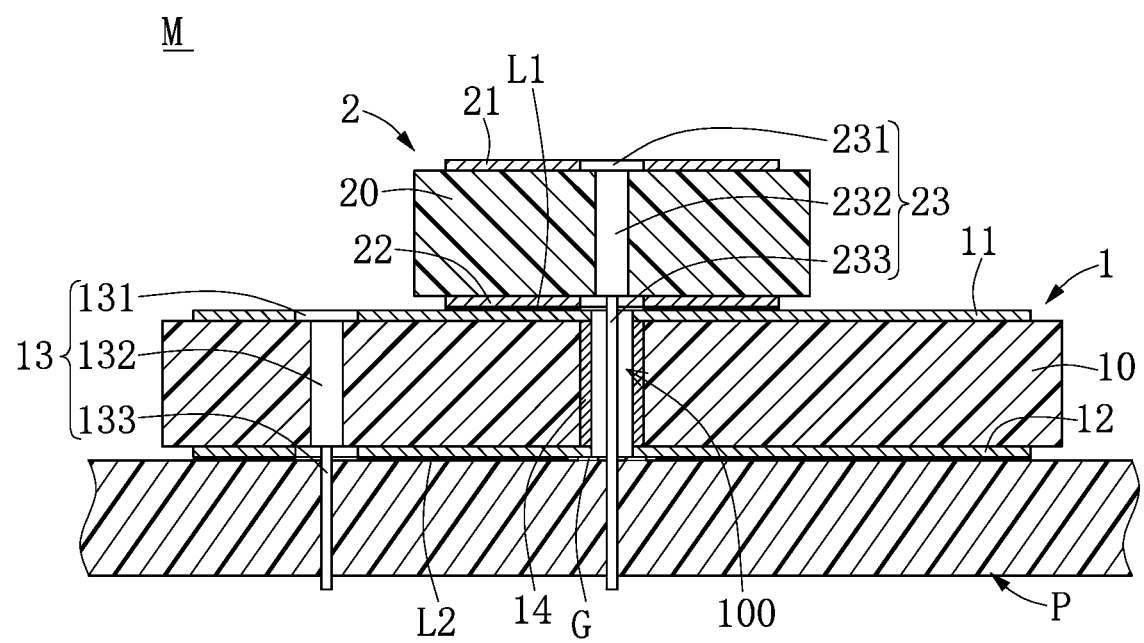
FIG. 6 shows an assembly, schematic view of the stacked antenna module according to the fourth embodiment of the present disclosure.

Referring to FIG. 6, the fourth embodiment of the present disclosure provides a stacked antenna module M, including a first antenna structure 1 and a second antenna structure 2. Comparing FIG. 6 with FIG. 2, the difference between the fourth embodiment and the first embodiment is as follows: in the fourth embodiment, the first bottom electrode layer 12 can be electrically contacted to a ground area G of the circuit substrate P, and the surrounding insulation layer 14 can be connected between the first top electrode layer 11 and the first bottom electrode layer 12 and electrically connected to the ground area G of the circuit substrate P through the first bottom electrode layer 12.

Fifth Embodiment

Figure 7:
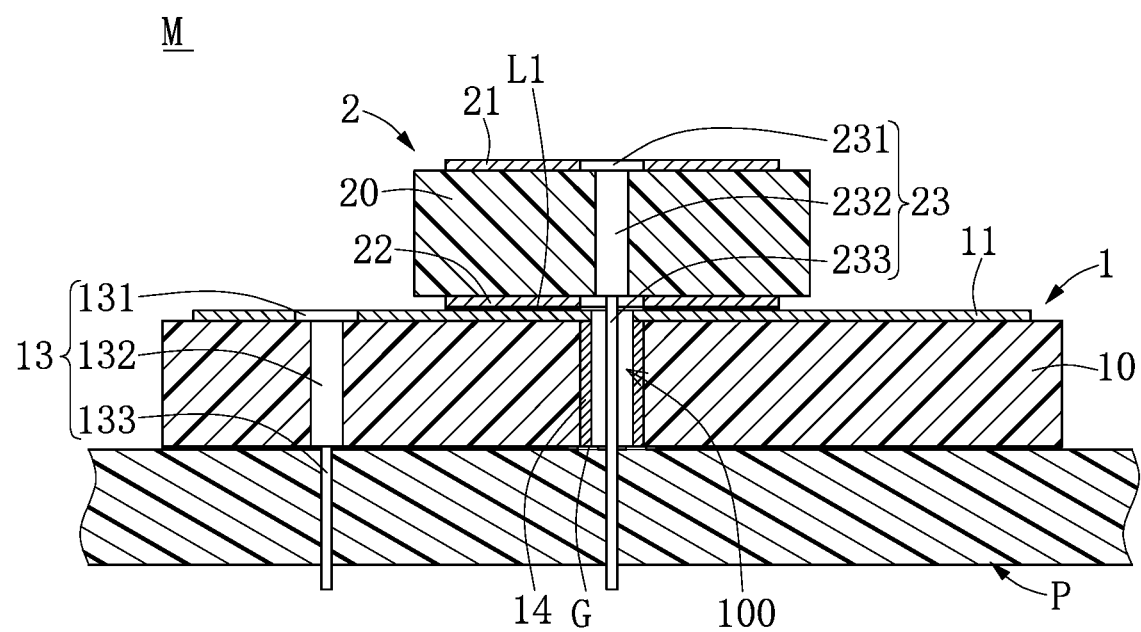
FIG. 7 shows an assembly, schematic view of the stacked antenna module according to the fifth embodiment of the present disclosure.

Referring to FIG. 7, the fifth embodiment of the present disclosure provides a stacked antenna module M, including a first antenna structure 1 and a second antenna structure 2. Comparing FIG. 7 with FIG. 2, the difference between the fifth embodiment and the first embodiment is as follows: in the fifth embodiment, the surrounding insulation layer 14 can be connected between the first top electrode layer 11 and a ground area G of the circuit substrate P. That is to say, a first bottom electrode layer 12 can be omitted in the fifth embodiment, so that the surrounding insulation layer 14 can directly contact the ground area G of the circuit substrate P.

Sixth Embodiment

Figure 8:
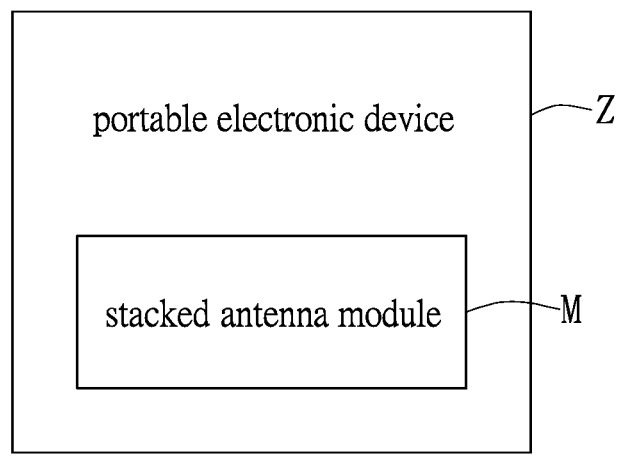
FIG. 8 shows a function block of a portable electronic device according to the sixth embodiment of the present disclosure.

Referring to FIG. 8, the sixth embodiment of the present disclosure provides a portable electronic device Z using a stacked antenna module M of one of the first to the fifth embodiments. For example, referring to FIG. 2 and FIG. 8, the portable electronic device Z uses the stacked antenna module M of the first embodiment, and the stacked antenna module M includes a first antenna structure 1 and a second antenna structure 2.

More particularly, referring to FIG. 2 and FIG. 8, the second antenna structure 2 is stacked on the first antenna structure 1 and insulated from the first antenna structure 1. In addition, the first antenna structure 1 includes a first carrier substrate 10 having at least one through hole 100, a surrounding insulation layer 14 disposed inside the at least one through hole 100, and a first feeding pin 13 passing through the first carrier substrate 10. Moreover, the second antenna structure 2 includes a second carrier substrate 20 and a second feeding pin 23 passing through the second carrier substrate 20, and the second feeding pin 23 can pass through the surrounding insulation layer 14 without contacting the surrounding insulation layer 14.

In conclusion, by matching the features of "the first antenna structure 1 including a first carrier substrate 10 having at least one through hole 100, a surrounding insulation layer 14 disposed inside the at least one through hole 100, and a first feeding pin 13 passing through the first carrier substrate 10" and "the second antenna structure 2 including a second carrier substrate 20 and a second feeding pin 23 passing through the second carrier substrate 20, and the second feeding pin 23 passing through the surrounding insulation layer 14 without contacting the surrounding insulation layer 14", the interference model generated by the second antenna structure 2 can be decreased or suppressed, and the main model generated by the second antenna structure 2 can be increased or presented obviously.

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:

1. A stacked antenna module, comprising:
a first antenna structure disposed on a circuit substrate;
an insulating connection layer disposed on the first antenna structure; and
a second antenna structure disposed on the insulating connection layer;
wherein the first antenna structure includes a first carrier substrate having at least one through hole, a first top electrode layer disposed on a top surface of the first carrier substrate, and a first feeding pin passing through the first carrier substrate and electrically connected to the first top electrode layer;

wherein the second antenna structure includes a second carrier substrate, a second top electrode layer disposed on a top surface of the second carrier substrate, and a second feeding pin passing through the second carrier substrate and electrically connected to the second top electrode layer;

wherein the first antenna structure includes a surrounding insulation layer disposed inside the at least one through hole and connected to the first top electrode layer, and the second feeding pin passes through the surrounding insulation layer without contacting the surrounding insulation layer;

wherein the first feeding pin has a first top portion connected to the first top electrode layer and partially exposed out of the first top electrode layer, a first embedded portion connected to the first top portion and embedded inside the first carrier substrate, and a first pin portion connected to the first embedded portion and exposed out of the first carrier substrate, a diameter of the first embedded portion is larger than a diameter of the first pin portion, and the first pin portion is electrically connected to the circuit substrate, wherein the second feeding pin has a second top portion connected to the second top electrode layer and partially exposed out of the second top electrode layer, a second embedded portion connected to the second top portion and embedded inside the second carrier substrate, and a second pin portion connected to the second embedded portion and exposed out of the second carrier substrate, a diameter of the second embedded portion is larger than a diameter of the second pin portion, and the second pin portion passes through the surrounding insulation layer without matching a nut and contacting the surrounding insulation layer and is electrically connected to the circuit substrate;

wherein a top surface of the first top portion is flush with a top surface of the first top electrode layer, and a top surface of the second top portion is flush with a top surface of the second top electrode layer.

2. The stacked antenna module of claim 1, wherein the first antenna structure includes a first bottom electrode layer disposed on a bottom surface of the first carrier substrate, and the surrounding insulation layer is connected between the first top electrode layer and the first bottom electrode layer.

3. The stacked antenna module of claim 1, wherein the first antenna structure includes a first bottom electrode layer disposed on a bottom surface of the first carrier substrate, the first bottom electrode layer is electrically contacted to a ground area of the circuit substrate, and the surrounding insulation layer is connected between the first top electrode layer and the first bottom electrode layer and electrically connected to the ground area of the circuit substrate through the first bottom electrode layer.

4. The stacked antenna module of claim 1, wherein the surrounding insulation layer is connected between the first top electrode layer and a ground area of the circuit substrate.

5. A stacked antenna module, comprising:
a first antenna structure; and
a second antenna structure stacked on the first antenna structure and insulated from the first antenna structure;
wherein the first antenna structure includes a first carrier substrate having at least one through hole, a surrounding insulation layer disposed inside the at least one through hole, and a first feeding pin passing through the first carrier substrate;

wherein the second antenna structure includes a second carrier substrate and a second feeding pin passing through the second carrier substrate, and the second feeding pin passes through the surrounding insulation layer without contacting the surrounding insulation layer;

wherein the first feeding pin has a first top portion connected to the first top electrode layer and partially exposed out of the first top electrode layer, a first embedded portion connected to the first top portion and embedded inside the first carrier substrate, and a first pin portion connected to the first embedded portion and exposed out of the first carrier substrate, a diameter of the first embedded portion is larger than a diameter of the first pin portion, and the first pin portion is electrically connected to the circuit substrate, wherein the second feeding pin has a second top portion connected to the second top electrode layer and partially exposed out of the second top electrode layer, a second embedded portion connected to the second top portion and embedded inside the second carrier substrate, and a second pin portion connected to the second embedded portion and exposed out of the second carrier substrate, a diameter of the second embedded portion is larger than a diameter of the second pin portion, and the second pin portion passes through the surrounding insulation layer without matching a nut and contacting the surrounding insulation layer and is electrically connected to the circuit substrate;

wherein a top surface of the first top portion is flush with a top surface of the first top electrode layer, and a top surface of the second top portion is flush with a top surface of the second top electrode layer.

6. The stacked antenna module of claim 5, wherein the first antenna structure is disposed on a circuit substrate, the first antenna structure includes a first top electrode layer disposed on a top surface of the first carrier substrate and a first bottom electrode layer disposed on a bottom surface of the first carrier substrate, and the surrounding insulation layer is connected between the first top electrode layer and the first bottom electrode layer.

7. The stacked antenna module of claim 5, wherein the first antenna structure is disposed on a circuit substrate, the first antenna structure includes a first top electrode layer disposed on a top surface of the first carrier substrate and a first bottom electrode layer disposed on a bottom surface of the first carrier substrate, the first bottom electrode layer is electrically contacted to a ground area of the circuit substrate, and the surrounding insulation layer is connected between the first top electrode layer and the first bottom electrode layer and electrically connected to the ground area of the circuit substrate through the first bottom electrode layer.

8. The stacked antenna module of claim 5, wherein the first antenna structure is disposed on a circuit substrate, the first antenna structure includes a first top electrode layer disposed on a top surface of the first carrier substrate, and the surrounding insulation layer is connected between the first top electrode layer and a ground area of the circuit substrate.

* * * * *